United States Patent [19]
Hooper

[11] 4,099,128
[45] Jul. 4, 1978

[54] LINE TYPE MODULATOR FOR PROVIDING STEPWISE VARIABLE PULSE WIDTH

[75] Inventor: Edward H. Hooper, Catonsville, Md.

[73] Assignee: Westinghouse Electric Corp., Pittsburgh, Pa.

[21] Appl. No.: 714,217

[22] Filed: Aug. 13, 1976

[51] Int. Cl.² .................................. H03K 1/00; H03K 3/04; H03K 5/04
[52] U.S. Cl. ................................... 328/65; 307/265; 328/67; 332/9 R; 328/58
[58] Field of Search ................. 328/65, 66, 67, 58; 307/265; 332/9

[56] References Cited
U.S. PATENT DOCUMENTS

| | | | |
|---|---|---|---|
| 3,296,551 | 1/1967 | Staples | 328/65 |
| 3,424,925 | 1/1969 | Gagliardi et al. | 328/67 |
| 3,590,279 | 6/1971 | Thompson et al. | 328/67 |
| 3,611,210 | 10/1971 | Theodore | 328/67 |

Primary Examiner—Stanley D. Miller, Jr.
Attorney, Agent, or Firm—R. M. Trepp

[57] ABSTRACT

A line type modulator incorporating a pulse forming network, pulse forming network charging means, switches, and switch selection means is described wherein a selected number of switches are simultaneously closed to discharge the energy in the pulse forming network across a load in a predetermined time. The pulse width or duration of discharge is varied stepwise by the particular combination of switches closed.

8 Claims, 15 Drawing Figures

LINE TYPE MODULATOR FOR PROVIDING STEPWISE VARIABLE PULSE WIDTH

BACKGROUND OF THE INVENTION

1. Field of the Invention

This invention relates to line type modulators, and more particularly, variable pulse width, constant energy line type modulators utilizing a pulse forming network.

2. Description of the Prior Art

In the prior art, the pulse width of the line type modulator could be altered by discharging part of the energy in the pulse forming network through a dummy load. One end of the pulse forming network would be attached to the load while the other end would be attached to the dummy load. Switches would connect the load and dummy load to the common side of the pulse forming network. In operation, one switch would be closed connecting the dummy load across the pulse forming network which would start a partial discharge propagating from the dummy end to the load end of the pulse forming network. After a predetermined time, a switch would connect the load to the pulse forming network which would start a partial discharge propagating from the load end to the dummy load end of the pulse forming network. The two pulses upon traveling the length of the pulse forming network would turn off the switch at that end. The spacing of time between the turn-on of the switch connecting the dummy load to the pulse forming network and the turn-on of the switch connecting the load to the pulse forming network determine the pulse time width at the load. One example of switches having the turn-off characteristic when the voltage went below a certain level is the thyratron. In the prior art a variation in pulse width resulted in a variation of the pulse energy delivered to the load. Another prior art configuration of a line type modulator utilized a pulse forming network with a load coupled to one end of the pulse forming network with a semiconductor switch. The switch at an appropriate time coupled a load to the pulse forming network whereupon the pulse forming network discharged across the load providing a fixed pulse width. The other end of the pulse forming network was left open. The pulse width for this configuration was a time for the partial discharge to propagate from the load end to the open end and back or twice the one way propagation time of the pulse forming network.

In the field of high energy laser systems, the need for lightweight high energy pulse modulators with the capability of changing pulse width on a pulse-to-pulse basis has been established. It is therefore desirable to provide a line type modulator which can deliver constant energy from pulse to pulse and at the same time have a stepwise variable pulse width. Furthermore, it is desirable that a line type modulator would utilize all solid state switches which are compact, lightweight, and immune to vibration as compared to thyratrons or other tube switches. It is desirable that the full energy storage capability of the pulse forming network is utilized or delivered to the load regardless of choice of pulse width, especially for laser applications.

SUMMARY OF THE INVENTION

In accordance with the present invention, a method and means is provided for providing constant energy pulses to a load wherein the pulse width is stepwise variable by charging a pulse forming network, coupling a load to a predetermined number of taps on the pulse forming network through a plurality of switches, selecting a number of switches corresponding to a predetermined pulse width, and closing simultaneously the selected switches to discharge the energy in the pulse forming network across the load.

DESCRIPTION OF THE PREFERRED EMBODIMENTS

Figure 1:
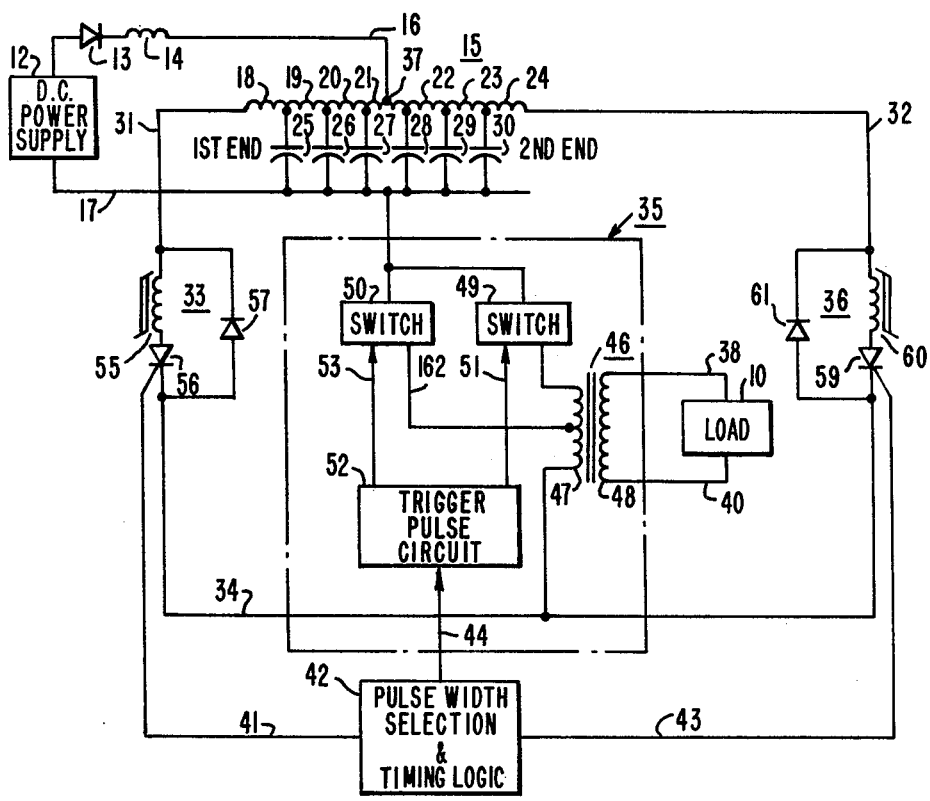
FIG. 1 is a schematic diagram of one embodiment of the invention.

Referring to FIG. 1, the embodiment of a line type modulator is shown for providing constant energy pulses wherein the pulse width is stepwise variable to a load 10. The electrical interconnection of FIG. 1 is described as follows. DC power supply 12 is coupled in series through diode 13 and inductor 14 to a tap on pulse forming network 15 over line 16. A return path to DC power supply 12 is coupled over line 17 from the common side of pulse forming network 15 such that the capacitors are charged. A typical output voltage for DC power supply 12 is 10,000 volts. Diode 13 functions to prevent current from flowing from the pulse forming network 15 back into the DC power supply 12. Diode 13 in conjunction with inductor 14 serves to form a resonant charging conduit for the pulse forming network 15 which enables the pulse forming network 15 to be charged in excess of the voltage of the DC power supply 12. Other charging methods are also applicable for charging pulse forming network 15. The resonant charging circuit composed of diode 13 and inductor 14 permits a DC power supply 12 having a voltage of 10,000 volts to charge the pulse forming network 15 to a voltage of 19,000 volts. The 19,000 volts appears across the capacitors in the pulse forming network. Pulse forming network 15 is conventional in the art comprised of a number of inductors 18 through 24 connected in series with one side of capacitors 25 through 30 connected at each junction of two inductors 18 through 24 to form a ladder network of capacitors with the other side of capacitors 25 through 30 connected together in common. Pulse forming network 15 is therefore a combination of inductors and capacitors combined together to simulate or form a transmission line having a characteristic impedance of $Z_0$ at either end of the ladder network comprised of inductors and capacitors. A typical value of $Z_0$ is 1 to 10 ohms. The free end of inductor 18 is coupled to line 31 and the free end of inductor 24 is coupled to line 32. The common side of capacitors 25 through 30 is coupled to line 17. The characteristic impedance of pulse forming network 15 is determined by the input impedance across line 31 and line 17 which represents a first end of pulse forming network 15. The characteristic impedance across line 32 and line 17 represents the characteristic impedance at the second end of pulse forming network 15. Typically the characteristic impedance of the pulse forming network 15 is the same at the first and second ends wich may be compared to the first and second ends of a transmission line having a characteristic impedance $Z_0$.

The first end of pulse forming network 15 is coupled by way of line 31 to one side of switch 33. The other side of switch 33 is coupled over line 34 to an input of impedance match circuit 35 and to one side of switch 36. A return path from impedance match circuit 35 is coupled from a second input to pulse forming network 15 over line 17. The second end of pulse forming network 15 is coupled over line 32 to one side of switch 36. The other side of switch 36 is coupled to an input of impedance match circuit 35. The output of impedance match circuit 35 is coupled over output lines 38 and 40 across load 10. Load 10 may be for example, a klystron tube in a radar set or a glow discharge tube for exciting laser medium in a gas laser. Impedance match circuit 35 functions to match the impedance connected to the input circuit to the impedance of load 10. Switches 33 and 36 function under the control of a control input to be in the conducting or non-conducting state. Switches 33 and 36 for example, must hold off or withstand a potential of 19,000 volts without breakdown and during conduction must withstand currents of 5,000 amps for example for several microseconds. Switches 33 and 36 must switch for example, energy in the amount of 475 joules per pulse. The control input of switch 33 is coupled over line 41 to an output of pulse width selection and timing logic 42. The control input of switch 36 is coupled over line 43 to a control output of pulse width selection and timing logic 42. An output of pulse width selection and timing logic 42 is coupled over line 44 to a control input of impedance match circuit 35 which functions to match the impedance on the input to the impedance on the output as a function of the selected pulse width.

Impedance match circuit 35 may for example comprise a transformer 46 which may or may not have a magnetic core and having a primary and second winding. One end of the secondary winding is coupled over line 38 to load 10 and the other end is coupled over line 40 to load 10. One end of the primary winding of transformer 46 is coupled over line 34 to one side of switch 33 and one side of switch 36. The other end of the primary winding is coupled to one side of switch 49. The other side of switch 49 is coupled over line 17 to pulse forming network 15. A tap on primary winding 47 is coupled to one side of switch 50. The other side of switch 50 is coupled over line 17 to pulse forming network 15. A control input of switch 49 is coupled over line 51 to a control output of trigger pulse circuit 52. A control input of switch 50 is coupled over line 53 to a control output of trigger pulse circuit 52. The control input of trigger pulse circuit 52 is coupled over line 44 to pulse width and timing logic 42. The impedance across impedance match circuit 35 is varied by using taps on the primary winding 47 of transformer 46. The taps are switched in and out by means of switches such as 49 and 50 under the control of trigger pulse circuit 52 so that the impedance match across the circuit may be varied from pulse to pulse under the control of pulse width selection and timing logic 42.

Figure 2A:
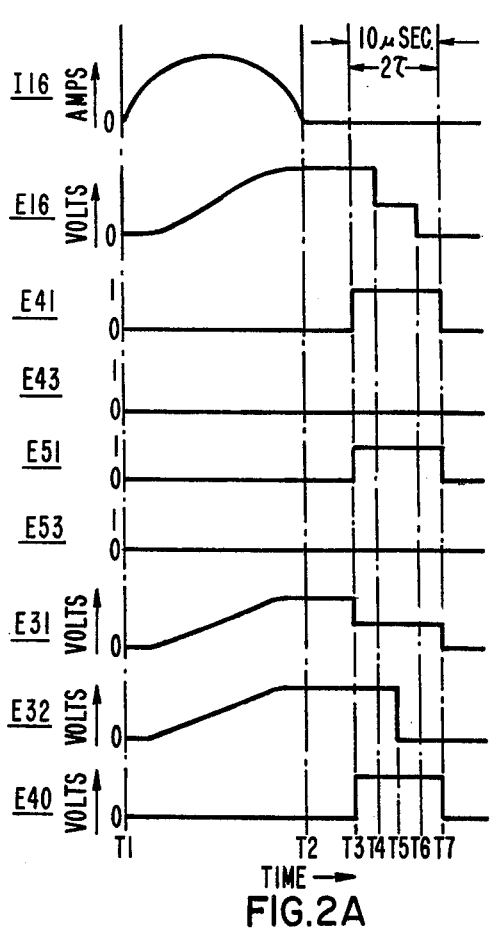
FIGS. 2A and 2B show typical waveforms generated by operation of the embodiment of FIG. 1.

Switch 33 may for example comprise a transformer 55 having a saturable core and having one winding with one end connected to line 31 and other end connected to the anode end of a series connected assembly of silicon controlled rectifiers represented by silicon controlled rectifier 57. The cathode of silicon controlled rectifier 56 is coupled to line 34 and to the anode of diode 57. The cathode of diode 57 is coupled to line 31 and to one end of transformer 55. Diode 57 is therefore coupled across the silicon controlled rectifier 56 and transformer 55. The control of silicon controlled rectifier 56 is coupled over line 41 an input of pulse width selection and timing logic 42. Silicon controlled rectifier 56 may for example consist of type T620 silicon controlled rectifiers, silicon controlled rectifier 56 may comprise an assembly of reverse switching rectifier (RSR) selected from the T62R series manufactured by Westinghouse Electric Corporation. Diode 57 may for example be a R620 series manufactured by Westinghouse Electric Corporation. Alternatively, silicon controlled rectifier 56 may be hydrogen thyratron tube, Type HY5 manufactured by EG&G Company. In the event switch 33 consists of RSR's or thyratrons, transformer 55 may be excluded. Switch 36 comprises silicon controlled rectifier 59, transformer 60 having a saturable core, and diode 61. Switch 36 is interconnected in the same manner as switch 33 with transformer 60 and the cathode of diode 61 connected to line 32 and the anode of diode 61 and the cathode of silicon controlled rectifier 59 coupled to line 34. Transformer 60 and silicon controlled rectifier 59 are connected in series with the control of silicon controlled rectifier coupled over line 43 to an input of pulse width selection and timing logic 42. The operation of the embodiment shown in FIG. 1 may be illustrated by referring to the curves in FIGS. 2A and 2B. Referring now to FIG. 2A, at time T1 to T2 pulse forming network 15 is charged to a voltage such as 19,000 volts which is represented in FIG. 2A by curve E16 which represents the voltage on line 16. The current on line 16 is represented by the curve I16. DC power supply 12 in conjunction with the resonant charging circuit diode 13 and inductor 14 charge the pulse forming network from T1 to T2 to 19,000 volts, for example. The DC power supply 12 may have a voltage for example of 10,000 volts. The voltages on lines 31 and 32 which are at either end of the pulse forming network 15 are also shown in FIG. 2A which between T1 and T2 are charged to 19,000 volts.

At time T3 the pulse forming network 15 is discharged by closing switch 33 which discharges the first end or line 31 of pulse forming network 15. A signal on line 41 shown as curve E41 in FIG. 2A goes from a logic 0 to a logic 1 at T3 to turn switch 33 on to a conducting state. E41 remains a logic 1 sufficiently long to cause switch 33 to go to its conducting state. Switch 33 remains on from T3 to T7 which is the time required to discharge pulse forming network 15. The switches are bistable for example if silicon controlled rectifiers are used. Bistable switches are turned on by a trigger pulse and remain conducting in the absence of trigger voltage so long as forward current flows through the switch from an external source, i.e., the pulse forming network 15. Switch 36 remains in the non-conducting state and control signal 43 to switch 36 remains a logic 0 as shown by curve E43 in FIG. 2A. Within the impedance match circuit 35, switch 49 is turn on to the conducting state by a signal on line 51 which is represented by curve E51 in FIG. 2A where the voltage goes from a logic 0 to a logic 1 from T3 to T7 to connect the end of the primary winding of transformer 46 to the common connection of line 17 of pulse forming network 15, the return back. Switch 50 remains in the non-conducting state and the signal on line 53 remains a logic 0 as shown by curve E53 in FIG. 2A. It being understood that a logic 1 on the control input to a switch will turn the switch on to a conducting state. At time T3 the voltage on line 31 goes to one half the previous charged voltage or 9,500 volts when switch 33 is closed. The one-half voltage travels or propagates along the pulse forming network to the other end, second end. The half voltage caused by the closing of switch 33 propagates along pulse forming network towards the other end. When the half voltage wave passes the tap 37 on the pulse forming network 15 at line 16, the voltage on line 16 as shown by curve E16 in FIG. 2A at time T4 goes to one-half voltage. When the voltage reaches the end of pulse forming network 15 at line 32, switch 36 is in the non-conducting state and line 32 is open, the voltage wave is reflected back towards the first end of pulse forming network 15 causing the voltage on line 32 at T5 to go to zero volts which is shown by curve E32. When the reflected wave passes the tap on pulse forming network at line 16 at T6 the voltage on line 16 goes to zero volts as shown by curve E16 in FIG. 2A. When the reflected half voltage wave, approximately 9,500 volts, reaches the first end of pulse forming network 15, the voltage on line 31 goes to zero volts as shown by curve E31 in FIG. 2A. From time T3 to T7, current is passing along line 31 through switch 33 over line 34 through primary winding 47 and switch 49 to line 17 which discharges pulse forming network 15. The current and primary winding 47 is coupled to the secondary winding 48 of transformer 46 causing current to flow on the secondary winding 48 through the load 10 by way of lines 40 and 38. The voltage on line 40 with respect to the voltage on line 38 is shown by curve E40 in FIG. 2A which is a rectangular pulse having a constant amplitude from time T3 to time T7. At time T7 the voltage returns to zero. The square wave shape of the pulse on load 10 is due to the fact that the energy coupled from pulse forming network 15 having a characteristic impedance is matched to the impedance of the load by impedance match circuit 35. If the impedance of the load 10 is not matched to the impedance of the pulse forming network 15 $Z_O$, then energy would be reflected back into the pulse forming network 15 causing subsequent output pulses from the pulse forming network 15 having lesser amplitude than the original pulse which would reoccur at various time intervals until the total energy of the pulse forming network has been expanded into load 10. Of course during this time, switch 33 should remain in the ON or conduction state to allow the load to be coupled to the pulse forming network 15.

For the case where switch 36 is closed and switch 33 remains open, the waveforms generated and operation of the line type modulator would be similar as previously described for where switch 33 is closed and switch 36 remains open. A square pulse wave going from logic 0 to a logic 1 on line 43 from T3 to T7 would turn switch 36 on. The voltage on line 41 would remain a logic 0 between T3 and T7 along with the voltage on line 53 which also would remain a logic 0. The voltage on line 51 would be a square wave pulse from time T3 to T7 to close switch 49 which results in the impedance of the pulse forming network, $Z_O$ being matched to the impedance of the load 10. The waveforms on lines 31 and 32 as shown in FIG. 2A would be interchanged for the case where switch 36 is closed and switch 33 is open. The voltage waveform on line 40 as shown in FIG. 2A would remain the same. Of course, the charging voltage I16 and E16 as shown in FIG. 2A also would remain the same.

Figure 2B:
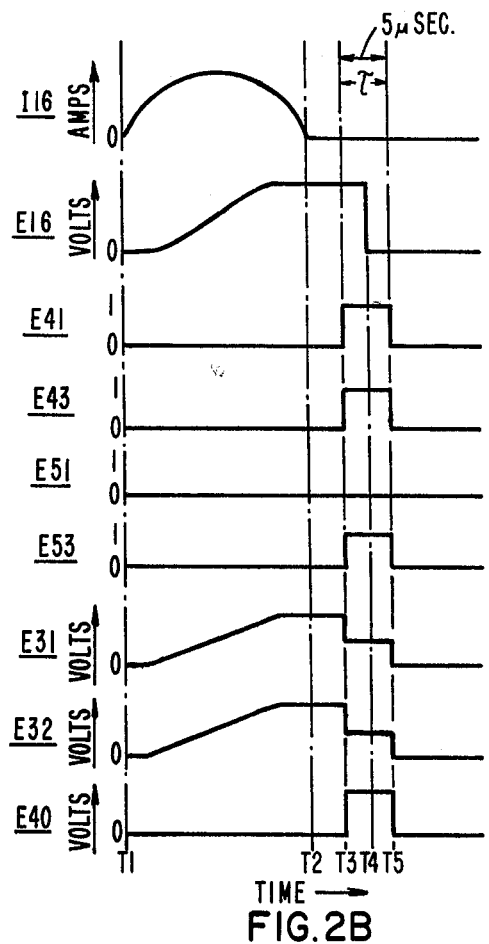

The operation of the embodiment of the invention shown in FIG. 1 for the case where switches 33 and 36 are closed simultaneously is described as follows. From time T1 to T2 pulse forming network 15 is charged to a voltage such as 19,000 volts as may be seen in FIG. 2B by curves I16 and E16 where I16 represents the current on line 16 and E16 represents the voltage. At time T3 the voltage on lines 41 and 43 shown as curves E41 and E43 in FIG. 2B go from a logic 0 to a logic 1 to turn switches 33 and 36 in the conduction or ON state. The voltage on line 53 from trigger pulse circuit 52 goes from a logic 0 to a logic 1 as shown by curve E53 in FIG. 2B which turns switch 50 on to the conduction state. The voltage on line 51 remains a logic 0 as shown by curve E51 in FIG. 2B which holds switch 49 in the OFF or non-conducting state. When switches 33, 36 and 50 are closed, the pulse forming network 15 is discharged from its first and second end simultaneously through a portion of primary 47 of transformer 46 to its tap connection to switch 50 and back to pulse forming network 15, line 17. When switch 33 is closed, a half voltage wave of approximately 9,500 volts is propagated from the first to the second end of pulse forming network 15. The voltage at the first end of pulse forming network 15 is shown by curve E31 in FIG. 2B which is the voltage on line 31. When switch 36 is likewise simultaneously closed, a half voltage waveform of 9,500 volts propagates from the second end of pulse forming network 15 towards its first end as may be shown by curve E32 in FIG. 2B. The half voltage waves from the first and second ends propagate towards the other end of pulse forming network 15 and when they pass the center of pulse forming network 15 such as at the tap where line 16 is connected, the voltage goes to zero volts as is shown by the curve E16 in FIG. 2B at time T4. When each respective half voltage wave of 9,500 volts reaches the other end of the pulse forming network from whence it started propagating, the voltage goes to zero as may be seen by curves E31 and E32 in FIG. 2B at time T5. The voltage at T5 goes to zero because no energy is reflected back from the load because the impedance of the load is matched to the impedance of the ends of the transmission lines. Since 33 and 36 are closed simultaneously the impedance looking in to both ends of the transmission line or pulse forming network 15 is one-half the characteristic impedance of the pulse forming network 15 or $Z_O/2$. The impedance of $Z_O/2$ is matched to the characteristic impedance of the load by varying the turns ratio on transformer 46 which is accomplished by taps on the primary winding 47 which is switched in and out of the return path to pulse forming network 15. The switches are controlled by trigger pulse circuit 52 which is governed by pulse width selection and timing logic 42. For a given pulse width, pulse width selection and timing logic 42 selects the switches to be turned on connecting the pulse forming network to the load and governs trigger pulse circuit 52 which selects the switches to be turned on to connect the appropriate tap or end of primary winding 47 to pulse forming network 15. The voltage across the load 10 is shown by curve E40 in FIG. 2B which shows a square wave pulse having a constant amplitude from time T3 to time T5 whereupon the voltage returns to zero. The voltage in curve E40 represents the voltage on line 40 in FIG. 1. The duration T3 to T5 represents the time $\tau$ which for example may be 5 microseconds as shown in FIG. 2B which represents the time required for a voltage pulse to propagate from the first end of pulse forming network 15 to its second end or vice versa.

Figure 3:
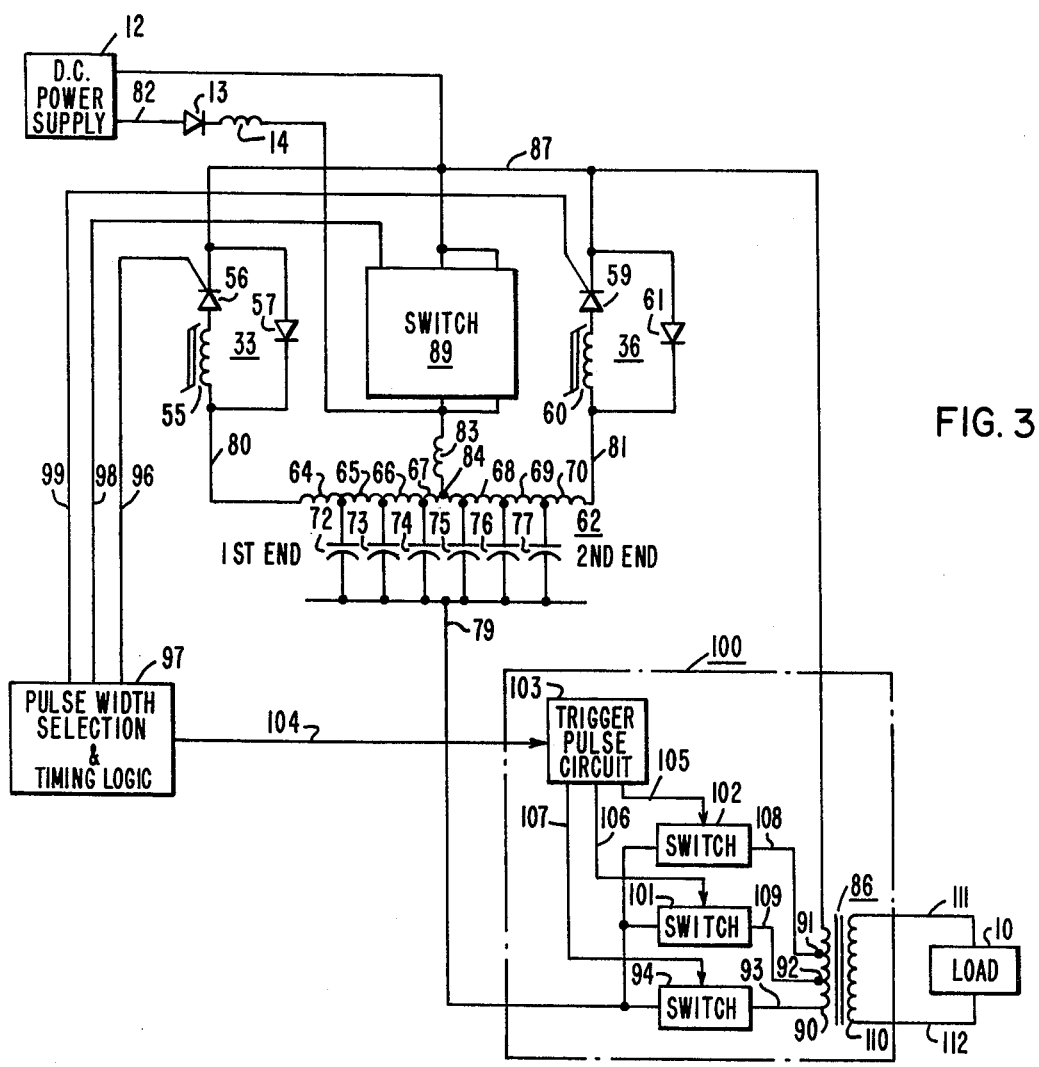
FIG. 3 shows an alternate embodiment of the invention.

Referring now to FIG. 3, an alternate embodiment of the invention is shown where a switch is added to show a center tap on the pulse forming network 62. Pulse forming network 62 has a plurality of inductors 64 through 70 connected in series with a plurality of capacitors 72 through 77 where one end of the capacitor is connected to a junction of two inductors forming a capacitor inductor ladder network with the other end of all of the capacitors connected together in common to line 79. The values of the inductors and capacitors are selected so that the ladder network forms a transmission line having a characteristic impedance $Z_O$ in the range for example of 1 to 10 ohms. The inductors 64 through 70 are connected end to end in ascending order with one end of the pulse forming network 62 being the end of inductor 64 which is connected to line 80. The first end of pulse forming network 62 is therefore between line 80 and line 79. Capacitor 72 is connected to the junction of inductors 64 and 65. Capacitor 73 is connected to the junction of inductors 65 and 66. Capacitor 74 is connected to the junction of inductors 66 and 67. Capacitor 75 is connected to the junction of inductors 67 and 68. Capacitor 76 is connected to the junction of inductors 68 and 69. Capacitor 77 is connected to the junction of inductors 69 and 70. The other end of inductor 70, line 81, in conjunction with line 79 forms the second end of pulse forming network 62 which has a characteristic impedance of $Z_O$. DC power supply 12 is coupled over line 82 to the anode of diode 13. The cathode of diode 13 is coupled through inductors 14 and 83 to a center tap on pulse forming network 62 which is at tap 84 which is a connection point to inductor 67. A return path from pulse forming network 62 is provided over line 79, transformer 86 and line 87. Line 87 is coupled to the return path of DC power supply 12 and to one side of switches 33, 36 and 89. Line 87 is coupled to one end of the primary winding 90 of transformer 86. Primary winding 90 has a first tap 91 and a second tap 92. The other end of primary winding 90 is coupled over line 93 to one side of switch 94. The side of switch 94 is coupled over line 79 to pulse forming network 62. The other side of switch 33 is coupled over line 80 to the first end of pulse forming network 62. The other side of switch is coupled over line 81 to the second end of pulse forming network 62. The other side of switch 89 is coupled through inductor 83 to the center tap 84 of pulse forming network 62. Inductor 83 functions to match the inductance or impedance at switch 89 to the characteristic impedance of the pulse forming network 62, $Z_O$. The control of switch 33 is coupled over line 96 to pulse width selection and timing logic 97. The control of switch 89 is coupled over line 98 to pulse width selection and timing logic 97. The control of switch 36 is coupled over line 99 to pulse width selection and timing logic 97. Pulse width selection and timing logic 97 functions to control the discharge of pulse forming network 62 to form a pulse having a preselected width which is achieved by controlling switches 33, 89 and 96 along with controlling impedance match circuit 100 to provide a pulse of constant energy including all of the energy of the pulse forming network 62 to load 10. Impedance match circuit 100 functions to match the impedance of the discharging pulse forming network to load 10. The impedance of the pulse forming network presented to the load varies as a function of the number of points or taps that are closed on the pulse forming network 62 to discharge the pulse forming network 62. Impedance match circuit 100 includes transformer 86, switches 94, 101 and 102, and trigger pulse circuit 103. Trigger pulse circuit 103 is controlled by a signal from pulse width selection and timing logic 97 over line 104. The control of switch 102 is coupled over line 105 to trigger pulse circuit 103. The control of switch 101 is coupled over line 106 to trigger pulse circuit 103. The control of switch 94 is coupled over line 107 to trigger pulse circuit 103. Trigger pulse circuit 103 functions to control switches 94, 101 and 102 in response to a signal from pulse width selection and timing logic 97 over line 104. One side of switch 102 and one side of switch 101 are coupled to pulse forming network 62 over line 79. The other side of switch 102 is coupled over line 108 to tap 91 on primary 90 of transformer 86. The other side of switch 101 is coupled over line 109 to tap 92 on primary 90 of transformer 86. By closing switches 102, 101 or 94, pulse forming network 62 is coupled to a portion or all of the inductance of primary winding 90 of transformer 86. Secondary winding 110 of transformer 86 has one end coupled over line 111 to load 10. The other side of secondary 110 is coupled over line 112 to load 10.

Figure 4:
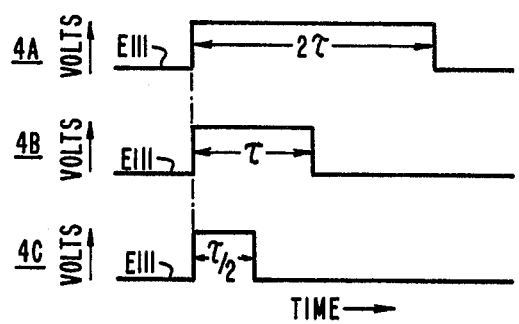
FIGS. 4A, 4B and 4C show typical waveforms generated during the operation of the embodiment shown in FIG. 3.

In operation between pulses to load 10 DC power supply 2 in conjunction with diode 13 and inductor 14 charge pulse forming network 62 to a voltage such as 19,000 volts. The energy of pulse forming network 62 is transferred to the load 10 by closing one or a combination of switches 33, 89 and 36 simultaneously which result in the discharge of pulse forming network 62 to the load 10. If either switch 33 or switch 36 is closed while the other switch and switch 89 remain open, a voltage wave of approximately one-half voltage or 9,500 volts will propagate from one end of the pulse forming network to the other and back for a total propagation time of $2\tau$. The voltage pulse to load 10 is shown by curve E111 in FIG. 4A, where the ordinate represents the voltage and the abscissa represents time. If switches 33 and 36 are closed simultaneously while switch 89 remains open, a one-half wave voltage of approximately 9,500 volts will be propagated from the first and second end of pulse forming network 62 towards the other end resulting in a voltage pulse to the load 10 of duratin $\tau$ as shown by curve E111 in FIG. 4B. When the half voltage wave arrives at the other end of pulse forming network 62 no energy is reflected back into the pulse forming network 62 and the voltage goes to zero at the respective end. If switches 33, 89 and 36 are closed simultaneously then each end of pulse forming network 62 will send or propagate a half voltage wave towards the middle, tap 84, of pulse forming network 62 and the center tap 84 of pulse forming network 62 will propagate a half voltage wave towards the first and second ends of pulse forming network 62. When the half voltage waves propagate from each end of pulse forming network 62 to the middle arrive, the voltage at the middle, tap 84 will go to zero volts. When the half voltage waves initiated (due to the closing switch 89)

and propagating from the middle, tap 84, towards the first and second ends arrive, the voltage at the first and second ends of pulse forming network 62 will go to zero. The voltage pulse to load 10 is shown by curve E111 in FIG. 4C having a time duration of $\tau/2$ due to the fact that the discharge of pulse forming network 62 lasts for one-half the propagation time of the pulse forming network 62. Impedance matching circuit 100 matches the impedance of the first and second end and the middle, tap 84, of pulse forming network 62 to the load 10 such that when the half voltage wave is propagating in pulse forming network arrive at the middle or end they will be terminated with no voltage reflected back into the pulse forming network 62. The ordinate in curves 4B and 4C represents voltage and the abscissa represents time.

Figure 5:
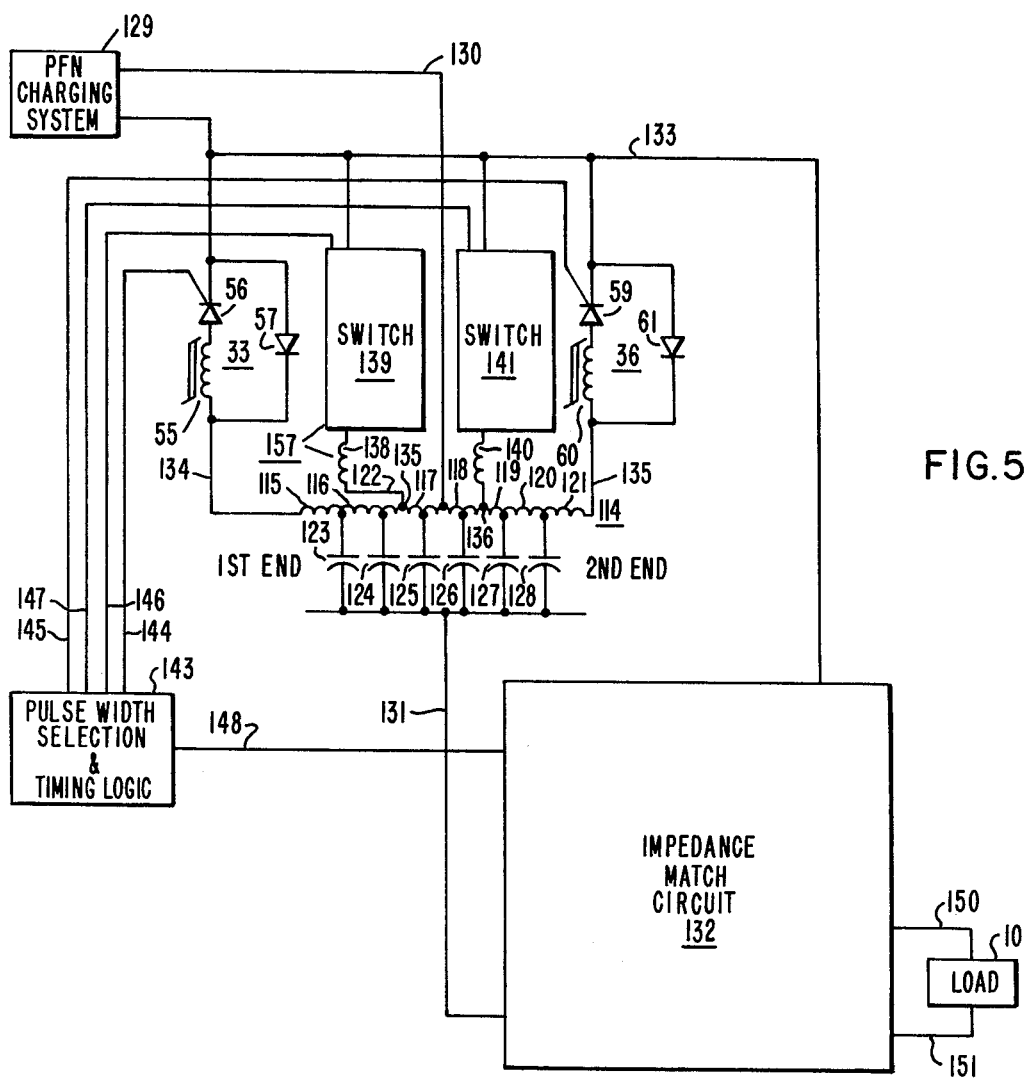
FIG. 5 shows an alternate embodiment of the invention.

Referring to FIG. 5 an alternate embodiment of the invention is shown for generating constant energy pulses having a number of pulse widths. Pulse forming network 114 is comprised of a series of inductors 115 through 121 connected in series with capacitors 123 through 128 having one side connected in common and the other side connected at inductor junctions to form a ladder network having transmission line characteristics with an impedance $Z_O$. One side of capacitor 123 is coupled to the junction of inductors 115 and 116. One side of capacitor 124 is connected to the junction of inductors 116 and 117. One side of capacitor 125 is connected to the junction of inductors 117 and 118. One side of capacitor 126 is connected to the junction of inductors 118 and 119. One side of capacitor 127 is connected to the junction of inductors 119 and 120. One side of capacitor 128 is connected to the junction of inductors 120 and 121. The end of inductor 115 forming a first end of pulse forming network 114 and the end of inductor 121 forming the second end of pulse forming network 114 with the common side of all capacitors forming the return path for pulse forming network 114. The impedance between the first end of pulse forming network 114 is $Z_O$ which may be typically 1 to 10 ohms. The impedance of the second end of pulse forming network 114 is likewise $Z_O$. Pulse forming network charging system which functions to charge pulse forming network 114 is coupled over line 130 to pulse forming network 114 with a return path coupled over line 131, impedance match circuit 132 and line 133 to pulse forming network charging system 129. The first end of pulse forming network 114 is coupled over line 134 to one side of switch 33 and the other side is coupled to line 133. The second end of pulse forming network 114 is coupled over line 135 to one side of switch 36 and the other side of switch is coupled to line 133. Pulse forming network 114 has a tap for external connection designated 135 and located one-third of the way from the first end to the second end of pulse forming network 114. Tap 136 is located one-third of the way from the second end to the first end of pulse forming network 114. If a voltage pulse is propagated from the first end towards the second end of pulse forming network 114, the wave will pass tap 135 at one-third of the propagation time and the wave will pass tap 136 at two-thirds of the propagation time. Tap 135 is coupled through inductor 138 to one side of switch 139 and the other side of switch 139 is coupled to line 133. Tap 136 is coupled over inductor 140 to one side of switch 141 and the other side of switch 141 is coupled to line 133. Inductance 138 and 140 which are in series with the tap 135 and switch 139 or tap 136 and switch 141, respectively, are a matching impedance for network termination at the tap. Switch 33 is controlled by a signal from pulse width selection and trigger logic 143 over line 144. Switch 36 is controlled by a signal over line 145. Switch 139 is controlled by a signal over line 146. Switch 141 is controlled by a signal over line 147. Lines 145, 146 and 147 are coupled to pulse width selection and trigger logic 143 which generates the appropriate signals over the lines to control the conduction of the switches. In addition pulse width selection and trigger logic 143 sends a signal to impedance match circuit 132 over line 148. When pulse forming network 114 is discharged current flows over lines 131 and 133 into and out of impedance match circuit 132. Impedance match circuit 132 couples the pulse forming network to load 10 and matches the impedance of the pulse forming network to the load 10. Load 10 is coupled to impedance match circuit 132 over lines 150 and 151. The impedance of pulse forming network 114 as presented to the impedance match circuit 132 is dependent upon the combination of switches closed. Pulse width selection and trigger logic 143 controls the combination of switches closed to produce a particular pulse width and sends a signal over line 148 to impedance match circuit 132 to match the load impedance to the impedance of pulse forming network for the particular combination of switches closed. In this manner the impedance of the pulse forming network 114 for every discharge pulse will match the load impedance 10 through impedance match circuit 132.

Figure 6:
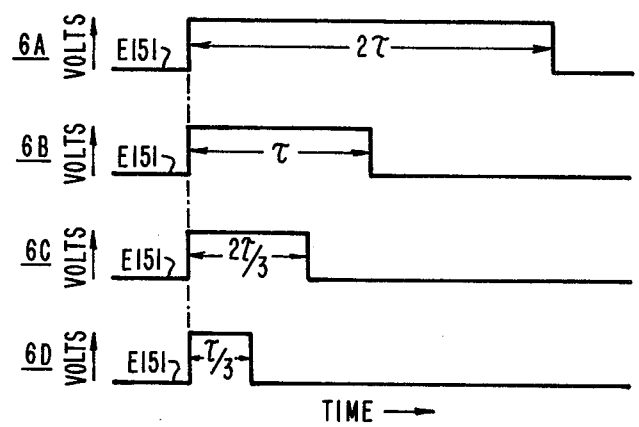
FIGS. 6A, 6B, 6C and 6D show typical waveforms generated during the operation of the embodiment shown in FIG. 5.

The discharge of pulse forming network 114 of all its energy is controlled by the combination of switches closed of switches 33, 139, 141, and 36. If switch 33 is closed, a half voltage wave will propagate from the first end of pulse forming network 114 to its second end. When the half voltage wave reaches the second end of pulse forming network 114, it will be reflected back to the first end. When the half voltage wave reaches the first end, the pulse forming network 114 will be completely discharged and the energy delivered to load 10 may be represented by the voltage on line 151 and shown as curve E151 in FIG. 6A. The duration of the pulse is $2\tau$ where $\tau$ is the propagation delay time for a voltage wave to propagate from the first end to the second end of pulse forming network 114. If switch 33 and switch 36 are closed simultaneously then a half voltage wave will be propagated from the first end towards the second end and a half voltage wave will be propagated from the second end towards the first end. When the voltage waves reach the other end, they will be terminated by the impedance of the impedance match circuit 132. The duration of the pulse delivered to the load will therefore be time $\tau$ as shown by curve E151 in FIG. 6B. If switch 33 and 141 are closed simultaneously a half voltage wave will propagate from the first end towards tap 136 and a half voltage wave will propagate from tap 136 towards the first end and a half voltage wave will propagate from tap 136 towards the second end. When the half voltage wave reaches the second end it will be reflected back towards tap 136 whereupon it will terminate when the half voltage wave from the first end reaches the tap 136 it will terminate and when the half voltage wave from tap 136 reaches the first end it will terminate due to the fact that the switch is closed connecting the first end and tap 136 to the impedance match circuit 132. The time duration of the pulse is $\frac{2}{3}\tau$ since the half voltage waves propagate two-thirds the length of the pulse forming network and are terminated. The energy delivered to the load may be represented by the voltage on line E151 which has a pulse duration of $\frac{2}{3}\tau$ shown in FIG. 6C. If switches 33, 139, 141 and 36 are closed simultaneously, then the first end of pulse forming network 114 will send a half voltage wave towards tap 135 which will be terminated when it reaches tap 135. A half voltage wave will be generated from tap 135 propagating towards the first end which will be terminated when the wave reaches the first end. A half voltage wave will be propagated from tap 135 towards tap 136 which will be terminated when the wave reaches tap 136. A half voltage wave will be generated from tap 136 and propagated towards tap 135 which upon arrival will be terminated at tap 135. A half voltage wave will be propagated from tap 136 towards the second end which will be terminated when it reaches the second end. A half voltage wave will be propagated from the second end towards tap 136 which will be terminated when it reaches tap 136. The duration of all half voltage waves therefore will be $\frac{2}{3}\tau$ since they travel one-third of the distance of pulse forming network 114. The voltage on line 151 representing the energy pulse through load 10 is shown in curve E151 in FIG. 6D. In FIGS. 6A, B, C and D, the ordinate represents voltage and the abscissa represents time.

Since the use of various combinations of switches for discharge of the pulse forming network 114 results in paralleling sections of pulse forming network 114 having a characteristic impedance of $Z_0$, the load 10 impedance required to match the pulse forming network 114 decreases directly with pulse width. For example, in FIG. 5, for a pulse width of $2\tau$ in which one switch 33 or 36 discharges the full pulse forming network 114, the matching load impedance is $Z_0$. For a pulse width of $\tau$, in which two switches 33 or 141, or switches 139 and 36 discharge the full pulse forming network 114, the matching load impedance is $Z_0/2$. For $\frac{2}{3}\tau$ operation, the matching load impedance is $Z_0/3$. For a pulse width of $\frac{1}{3}\tau$ pulse width in which switches 33, 139, 141 and 36 discharge the full pulse forming network 114, the matching load impedance is $Z_0/6$. By matching the impedance to the load with impedance match circuit 132 the total energy in the pulse forming network may be discharged to the load during each pulse independent of the pulse width selected.

Figure 7:
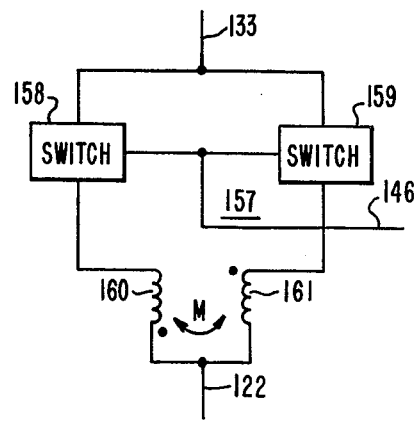
FIG. 7 shows a switch assembly.

Referring now to FIGS. 1, 3 and 5 for a given storage voltage on the pulse forming network, the peak pulse current through the switches used to discharge the pulse forming network is independent of the number of switches closed or operated for a particular pulse width. The end switches always carry one-half the discharge current of the tap switches because the end switches are discharging the pulse forming network from one direction. The tap switches however are discharging the pulse forming network in two directions towards the first and second ends of the pulse forming network simultaneously. Referring to FIG. 7 an alternate embodiment of switch assembly 157 of FIG. 5 is shown which divides the tap discharge current between two switches. Utilizing the alternate embodiment of switch assembly 157 in FIG. 7 the end switches and the tap switches would draw or conduct the same amount of current during a pulse forming network discharge. Line 133 is coupled to one side of switch 158 and one side of switch 159. Switches 158 and 159 may be constructed in the same manner as switches 33 or 36. The control of switches 158 and 159 is connected to line 146. Switches 158 and 159 are turned on into the conduction state in response to signals over line 146. The other side of switch 158 is coupled to line 122 through inductor 160. The other side of switch 159 is coupled to line 122 through inductor 161. Inductors 160 and 161 each have an inductance of twice the inductance of inductor 138 in FIG. 5. Inductors 160 and 161 are coupled together by mutual inductance such that current passing from line 122 to line 133 will be divided in inductors 160 and 161 and consequently divided through switches 158 and 159. In this manner, the peak current is divided between switches 158 and 159 which reduces the current carrying requirements of each switch.

The pulse forming network 15 shown in FIG. 1 is charged typically to 19,500 volts which requires the switch's use for discharging the pulse forming network 15 to hold off the 19,500 volts when the switches are opened. A switch that may hold off 19,000 is formed by connecting in series 24 reverse switching rectifiers also known as reverse blocking diode thyristors with a diode in parallel across each reverse switching rectifier with the diode anode attached to the cathode of the reverse switching rectifier. A typical reverse switching rectifier would be a type T62 series manufactured by Westinghouse Electric Corporation which would have a hold-off voltage of 800 volts per device. By using 24 devices, the hold-off voltage would be 19,200 volts. The reverse switching rectifier has a one volt drop at zero amps conduction, two volts drop at 2,000 amps conduction, and ten volts across the diode at 5,000 amps conduction. A switch comprised of 24 reverse switching rectifiers connected in series and close simultaneously is able to switch 475 joules per pulse.

Figure 8:
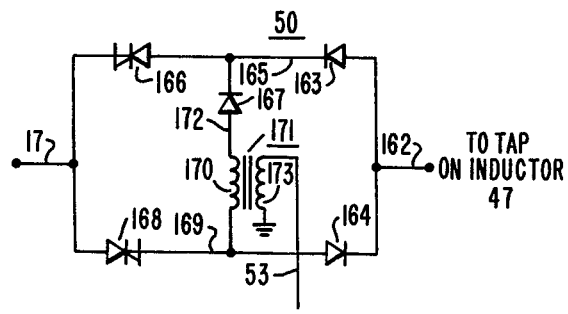
FIG. 8 shows a switch.

Referring to FIG. 8, an embodiment of switch 50 (FIG. 1) incorporating reverse switching rectifiers is shown. One side of switch 50 is coupled over line 162 to a tap on inductor 47. Within switch 50, line 162 is coupled to the anode of diode 163 and the cathode of diode 164. The cathode of diode 163 is coupled over line 165 to the anode of reverse switching rectifier 166 and the cathode of diode 167. The cathode of reverse switching rectifier 166 is coupled over line 17 to the anode of reverse switching rectifier 168 and to pulse forming network 15. Line 17 represents the other side of switch 50. The cathode of reverse switching rectifier 168 is coupled over line 169 to one side of the secondary winding 170 of transformer 171 and to the anode of diode 164. The other side of winding 170 is coupled over line 172 to the anode of diode 167. The control signal for switch 50 is coupled over line 53 to one side of the primary winding 173 of transformer 171. The other side of primary winding 173 is coupled to ground. Control signals over line 53 function to turn switch 50 in the conduction state by turning on the reverse switching rectifiers 166 and 168.

The embodiment of switch 50 shown in FIG. 8 is a bridge configuration of two reverse switching rectifiers (RSR's) or multiple reverse switching rectifier switch assemblies connected in series and two diodes or multiple diode assemblies connected in series. The reverse switching rectifiers are non-conducting or block current flow in both directions between line 17 and line 162. The reverse switching rectifiers are turned ON or to the conducting state by a high voltage impulse carrying a sufficient $dv/dt$ on lines 165 and 169 to trigger the reverse switching rectifiers.

The reverse switching rectifier is a four-region thyristor device similar to the silicon controlled rectifier except that the device is optimized to be turned on by dv/dt triggering. With di/dt triggering the switching current flows in the device due to capacitive displacement current through the device in response to the high dv/dt of the triggering impulse. Present reverse triggering rectifiers have hold-off voltage ratings of about 1,000 volts per device, and have pulse current capabilities of 5,000 amps with a di/dt of at least 2,500 amps per microsecond immediately upon turn-on. When multiple reverse switching rectifiers are connected in series, the devices may be switched on or into the conduction state by a high voltage impulse across the stack of assembly.

Figure 9:
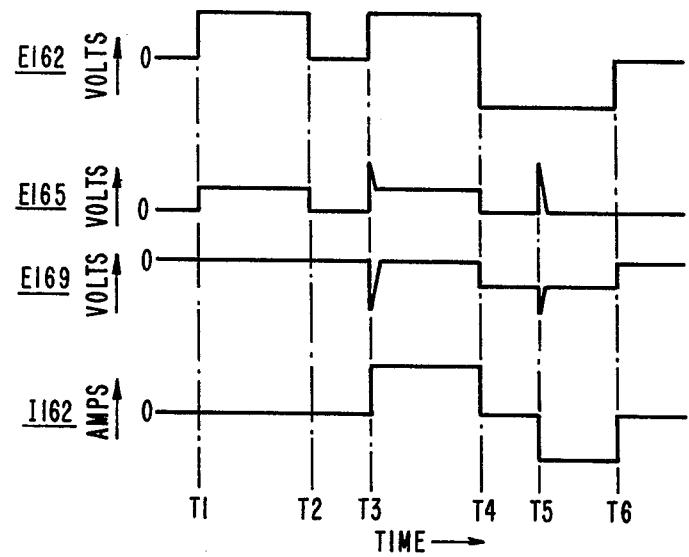
FIG. 9 shows typical waveforms generated by operation of the switch in FIG. 8.

The operation of the embodiment of FIG. 8 may be understood by reference to the waveforms in FIG. 9. In FIG. 9 the ordinate represents the amplitude of voltage or current depending upon the designation and the abscissa represents time. At time T1 a voltage on line 162 originating from the tap on inductor 47 will forward bias diode 163 and charge up the voltage on line 165 shown as curve E165 in FIG. 9. Reverse switching rectifier 166 however will not be turned ON because of insufficient high voltage impulse or dv/dt on line 165. Diode 164 will block the voltage on line 162 from line 169. The voltage on line 169 shown as curve E169 in FIG. 9 is unchanged during T1 to T2. Since the reverse switching rectifiers 166 and 168 are not turned ON, no current will flow through switch 50 as shown by curve I162 which represents the current on line 162. At time T3 a signal over line 53 causes transformer 171 to generate a trigger pulse on line 169 and 165. Diode 167 allows the voltage on line 172 to pass through to line 165. A voltage appearing at the same time on line 162 is represented by curve E162 at time T3. The dv/dt on line 165 and line 169 is sufficient to turn ON reverse switching rectifiers 166 and 168 at T3. The voltage on line 162 is positive and therefore passes through diode 163 and reverse switching rectifier 166. Diode 164 blocks the passage of any current through reverse switching rectifier 168. The current through the switch 50 is shown by curve I162 which continues until time T4 when the voltage on line 162 goes negative. At time T5 a signal over line 53 causes a high voltage impulse on lines 165 and 169 to turn ON reverse switching rectifiers 166 and 168 by dv/dt triggering. The voltage on line 162 is negative and current passes over line 17 through reverse switching rectifier 168 and through diode 164 to line 162. Diode 163 and diode 167 are reverse-biased and no current passes through reverse switching rectifier 166.

The embodiment shown in FIG. 8 is an improvement over a solid state switch utilizing silicon controlled rectifiers described by the inventor herein in U.S. Pat. No. 3,532,902. A key advantage of the reverse switching rectifier switch embodiment as shown in FIG. 8 is that the reverse switching rectifiers are "instantly" ON or conducting and capable of conducting the full amount of current immediately upon turn-on without the necessity of pre-triggering to ensure full turn-on when full current flows. The embodiment of FIG. 8 can be used for very high power short pulse (high di/dt) steering such as for changing taps on a transformer between pulses and during pulses for mid-pulse correction. The silicon controlled rectifiers have the major disadvantage in that they do not turn ON immediately for high conduction and that the control input must be isolated with a transformer for each silicon controlled rectifier.

The invention provides a method and apparatus for providing constant energy pulses to a load wherein the pulse width is stepwise variable by charging a pulse forming network, coupling a load to a predetermined number of taps on the pulse forming network through a plurality of switches, selecting a number of switches corresponding to a predetermined pulse width, closing simultaneously the selected switches to discharge the energy in the pulse forming network across the load. Means are also provided for sharing or splitting the discharge current among a plurality of switches to reduce the peak current through any one switch. Means are also provided for utilizing reverse switching rectifiers for the switches for coupling a load to the pulse forming network. In addition, reverse switching rectifiers are utilized in an embodiment for switching taps on a transformer for providing impedance matching between the pulse forming network and the load.

I claim as my invention:

1. A method for providing constant energy pulses to a load wherein the pulse width is stepwise variable comprising the steps of:

charging a pulse forming network, coupling a load to a predetermined number of taps on said pulse forming network through a plurality of switches, selecting a number of switches corresponding to a predetermined pulse width, and closing simultaneously said selected switches to completely discharge the total energy in said pulse forming network across the load.

2. The method of claim 1 including the additional step of matching the impedance of the load to the impedance of the coupling to the pulse forming network.

3. A method for providing constant energy pulses to a load wherein the pulse width is stepwise variable comprising the steps of:

charging a pulse forming network, coupling a load to a predetermined number of taps on said pulse forming network through a plurality of switches, selecting a number of switches corresponding to a predetermined pulse width, closing simultaneously said selected switches to discharge the energy in said pulse forming network across the load, and matching the impedance of the load to the impedance of the coupling to the pulse forming network wherein said step of matching includes the step of coupling the load to the secondary winding of a transformer, coupling the pulse forming network through the primary winding of the transformer, and modifying the turn's ratio of said primary to said secondary of said transformer.

4. The method of claim 3 wherein said step of modifying the turn's ratio includes the step of connecting the pulse forming network to taps on the primary winding on the transformer.

5. Apparatus for providing constant energy pulses to a load wherein the pulse width is stepwise variable comprising:

means for charging a pulse forming network, means for coupling a load to a predetermined number of taps on said pulse forming network through a plurality of switches, means for selecting a number of switches corresponding to a predetermined pulse width, and means for closing simultaneously said selected switches to completely discharge the total energy in said pulse forming network across the load.

6. The apparatus of claim 5 including means for matching the impedance of the load to the impedance of the coupling to the pulse forming network.

7. Apparatus for providing constant energy pulses to a load wherein the pulse width is stepwise variable comprising:

means for charging a pulse forming network, means for coupling a load to a predetermined number of taps on said pulse forming network through a plurality of switches, means for selecting a number of switches corresponding to a predetermined pulse width, means for closing simultaneously said selected switches to discharge the energy in said pulse forming network across the load, and means for matching the impedance of the load to the impedance of the coupling to the pulse forming network wherein said means for matching includes means for coupling the load to the secondary winding of a transformer, means for coupling the pulse forming network to the primary winding of the transformer, and means for modifying the turn's ratio of said primary to said secondary of said transformer.

8. The apparatus of claim 7 wherein said means for modifying the turn's ratio includes means for connecting the pulse forming network to taps on the primary winding of the transformer.

* * * * *